(12) United States Patent
Ting

(10) Patent No.: US 8,289,047 B2
(45) Date of Patent: *Oct. 16, 2012

(54) ARCHITECTURE AND INTERCONNECT SCHEME FOR PROGRAMMABLE LOGIC CIRCUITS

(75) Inventor: Benjamin S. Ting, Saratoga, CA (US)

(73) Assignee: Actel Corporation, Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/943,846

(22) Filed: Nov. 10, 2010

(65) Prior Publication Data

US 2011/0050282 A1    Mar. 3, 2011

Related U.S. Application Data

(63) Continuation of application No. 12/630,679, filed on Dec. 3, 2009, which is a continuation of application No. 12/215,118, filed on Jun. 24, 2008, now Pat. No. 7,646,218, which is a continuation of application No. 11/299,248, filed on Dec. 9, 2005, now Pat. No. 7,409,664, which is a continuation of application No. 10/692,880, filed on Oct. 23, 2003, now Pat. No. 7,017,136, which is a continuation of application No. 10/269,364, filed on Oct. 11, 2002, now Pat. No. 6,703,861, which is a continuation of application No. 09/955,589, filed on Sep. 13, 2001, now Pat. No. 6,507,217, which is a continuation of application No. 09/034,769, filed on Mar. 2, 1998, now Pat. No. 6,433,580, which is a continuation of application No. 08/484,922, filed on Jun. 7, 1995, now abandoned, which is a continuation of application No. 08/101,197, filed on Aug. 3, 1993, now Pat. No. 5,457,410.

(51) Int. Cl.
*H03K 19/177* (2006.01)
(52) U.S. Cl. .............................................. 326/41; 326/38
(58) Field of Classification Search ............... 326/37–41
See application file for complete search history.

(56) References Cited

U.S. PATENT DOCUMENTS

| | | |
|---|---|---|
| 3,473,160 A | 10/1966 | Wahlstrom |
| 4,020,469 A | 4/1977 | Manning |
| 4,207,556 A | 6/1980 | Sugiyama et al. |
| 4,642,487 A | 2/1987 | Carter |
| 4,661,901 A | 4/1987 | Veneski |
| 4,700,187 A | 10/1987 | Furtek |
| 4,706,216 A | 11/1987 | Carter |
| 4,720,780 A | 1/1988 | Dolecek |
| 4,736,333 A | 4/1988 | Mead et al. |

(Continued)

FOREIGN PATENT DOCUMENTS

CN    1048127 C    1/2000

(Continued)

OTHER PUBLICATIONS

Spandorfer, L.M., "Synthesis of Logic Functions on an Array of Integrated Circuits," Contract No. AF19 (628) 2907, Project No. 4645, Task No. 464504, Final Report, Nov. 30, 1965.

(Continued)

*Primary Examiner* — Don Le
(74) *Attorney, Agent, or Firm* — Lewis and Roca LLP

(57) ABSTRACT

An architecture of hierarchical interconnect scheme for field programmable gate arrays (FPGAs).

5 Claims, 11 Drawing Sheets

U.S. PATENT DOCUMENTS

| | | |
|---|---|---|
| 4,758,745 A | 7/1988 | Elgamal |
| 4,758,985 A | 7/1988 | Carter |
| 4,763,020 A | 8/1988 | Takata et al. |
| 4,786,904 A | 11/1988 | Graham, III et al. |
| 4,815,003 A | 3/1989 | Putatunda et al. |
| 4,847,612 A | 7/1989 | Kaplinsky |
| 4,855,619 A | 8/1989 | Hsieh et al. |
| 4,870,302 A | 9/1989 | Freeman |
| 4,912,342 A | 3/1990 | Wong et al. |
| 4,918,440 A | 4/1990 | Furtek |
| 4,935,734 A | 6/1990 | Austin |
| 4,963,770 A | 10/1990 | Keida |
| 4,967,107 A | 10/1990 | Kaplinsky |
| 4,992,680 A | 2/1991 | Benedetti et al. |
| 5,012,135 A | 4/1991 | Kaplinsky |
| 5,122,685 A | 6/1992 | Chan et al. |
| 5,140,193 A | 8/1992 | Freeman et al. |
| 5,144,166 A | 9/1992 | Camarota et al. |
| 5,187,393 A | 2/1993 | El Gamal et al. |
| 5,204,556 A | 4/1993 | Shankar |
| 5,208,491 A | 5/1993 | Ebeling et al. |
| 5,212,652 A | 5/1993 | Agrawal et al. |
| 5,220,213 A | 6/1993 | Chan et al. |
| 5,221,865 A | 6/1993 | Phillips et al. |
| 5,224,056 A | 6/1993 | Chene et al. |
| 5,225,221 A | 7/1993 | Camden et al. |
| 5,231,588 A | 7/1993 | Agrawal et al. |
| RE34,363 E | 8/1993 | Freeman |
| 5,243,238 A | 9/1993 | Kean |
| 5,256,918 A | 10/1993 | Suzuki |
| 5,260,610 A | 11/1993 | Pederson et al. |
| 5,260,611 A | 11/1993 | Cliff et al. |
| 5,291,079 A | 3/1994 | Goetting |
| 5,296,759 A | 3/1994 | Sutherland et al. |
| 5,298,805 A | 3/1994 | Garverick et al. |
| 5,327,023 A | 7/1994 | Kawana et al. |
| 5,329,470 A | 7/1994 | Sample et al. |
| 5,331,226 A | 7/1994 | Goetting |
| 5,336,950 A | 8/1994 | Popli et al. |
| 5,341,040 A | 8/1994 | Garverick et al. |
| 5,343,406 A | 8/1994 | Freeman et al. |
| 5,349,691 A | 9/1994 | Harrison et al. |
| 5,369,314 A | 11/1994 | Patel et al. |
| 5,371,422 A | 12/1994 | Patel et al. |
| 5,376,844 A | 12/1994 | Pederson et al. |
| 5,386,354 A | 1/1995 | Osteen |
| 5,396,126 A | 3/1995 | Britton et al. |
| 5,406,525 A | 4/1995 | Nicholes |
| 5,422,833 A | 6/1995 | Kelem et al. |
| 5,436,575 A | 7/1995 | Pedersen et al. |
| 5,444,394 A | 8/1995 | Watson et al. |
| 5,455,525 A | 10/1995 | Ho et al. |
| 5,457,410 A | 10/1995 | Ting |
| 5,469,003 A | 11/1995 | Kean |
| 5,477,067 A | 12/1995 | Isomura et al. |
| 5,483,178 A | 1/1996 | Costello et al. |
| 5,485,103 A | 1/1996 | Pederson et al. |
| 5,519,629 A | 5/1996 | Snider |
| 5,550,782 A | 8/1996 | Cliff et al. |
| 5,552,722 A | 9/1996 | Kean |
| 5,572,148 A | 11/1996 | Lytle et al. |
| 5,581,199 A | 12/1996 | Pierce et al. |
| 5,581,767 A | 12/1996 | Katsuki et al. |
| 5,598,109 A | 1/1997 | Leong et al. |
| 5,656,950 A | 8/1997 | Duong et al. |
| 5,668,771 A | 9/1997 | Cliff et al. |
| 5,835,405 A | 11/1998 | Tsui et al. |
| 5,847,578 A | 12/1998 | Noakes et al. |
| 5,848,005 A | 12/1998 | Cliff et al. |
| 5,850,564 A | 12/1998 | Ting et al. |
| 5,880,597 A | 3/1999 | Lee |
| 5,903,165 A | 5/1999 | Jones et al. |
| 6,016,063 A | 1/2000 | Trimberger |
| 6,034,547 A | 3/2000 | Pani et al. |
| 6,038,627 A | 3/2000 | Plants |
| 6,051,991 A | 4/2000 | Ting |
| 6,064,225 A | 5/2000 | Andrews et al. |
| 6,064,599 A | 5/2000 | Cliff et al. |
| 6,088,526 A | 7/2000 | Ting et al. |
| 6,160,420 A | 12/2000 | Gamal et al. |
| 6,433,580 B1 | 8/2002 | Ting |
| 6,462,578 B2 | 10/2002 | Ting |
| 6,507,217 B2 | 1/2003 | Ting |
| 6,525,563 B2 | 2/2003 | Hamano et al. |
| 6,597,196 B2 | 7/2003 | Ting |
| 6,686,768 B2 | 2/2004 | Comer |
| 6,703,861 B2 | 3/2004 | Ting |
| 6,747,482 B2 | 6/2004 | Ting |
| 6,989,688 B2 | 1/2006 | Ting |
| 6,998,872 B1 | 2/2006 | Chirania et al. |
| 7,017,136 B2 | 3/2006 | Ting |
| 7,078,933 B2 | 7/2006 | Ting |
| 7,142,012 B2 | 11/2006 | Ting |
| 7,409,664 B2 | 8/2008 | Ting |
| 7,646,218 B2 | 1/2010 | Ting |
| 2005/0231236 A1 | 10/2005 | Vest et al. |
| 2006/0028240 A1 | 2/2006 | Lui et al. |
| 2008/0218206 A1* | 9/2008 | Hecht .......................... 326/39 |
| 2008/0258764 A1* | 10/2008 | Deshmukh et al. ............. 326/41 |
| 2010/0073024 A1 | 3/2010 | Ting |

FOREIGN PATENT DOCUMENTS

| | | |
|---|---|---|
| CN | 1101082 C | 2/2003 |
| EP | 0415542 | 3/1991 |
| EP | 0 630 115 A2 | 12/1994 |
| EP | 0755588 B1 | 3/2002 |
| EP | 0806836 B1 | 11/2002 |
| EP | 0712548 B1 | 4/2003 |
| EP | 1162745 A3 | 5/2003 |
| EP | 1162746 B1 | 11/2005 |
| EP | 1594228 A2 | 11/2005 |
| EP | 1594228 A3 | 11/2005 |
| GB | 2180382 | 3/1987 |
| GB | 2295735 A | 6/1996 |
| JP | 3-139863 | 6/1991 |
| JP | 10-501934 A1 | 2/1998 |
| JP | 11-330248 | 11/1999 |
| JP | 2008278508 A | 11/2008 |
| WO | 9208286 | 5/1992 |
| WO | 9410754 | 5/1994 |
| WO | 9428475 A1 | 12/1994 |
| WO | 95/04404 A1 | 2/1995 |
| WO | 95/28769 A1 | 10/1995 |
| WO | 9635261 A1 | 11/1996 |
| WO | 2005104375 A1 | 11/2005 |

OTHER PUBLICATIONS

ATMEL Field Programmable Arrays, AT 6000 Series, 1993, p. 1-16.

Altera Corporation Date Sheet, Flex EPF81188 12,000 Gate Programamble Logic Device, Sep. 1992, V3er. 1, pp. 1-20.

Shoup, R.G., "Programmable Cellular Logic Arrays," Abstract, Ph.D. Dissertation, Carnegie Mellon University, Pittsburgh, PA, Mar. 1970, (partial) pp. ii-121.

Britton, et al., "Optimized Reconfigurable Cell Array Architecture for High-Performance Field Programmable Gate Arrays," Proceedings of the IEEE 1993 Custom Integrated Circuits Conference, 1993, pp. 7.2.1.-7.2.5.

Buffoli, E., et al., "Dynamically Reconfigurable Devices Used to Implement a Self-Tuning, High Performances PID Controller," 1989 IEEE, pp. 107-112.

Devades, S., et al., "Boolean Decomposition of Programmable Logic Arrays," IEEE 1988, pp. 2.5.1.-2.5.5.

Vidal, J.J., "Implementing Neural Nets with Programmable Logic," IEEE Transations on Acoustic, Speech, and Sgianl Processing, vol. 36, No. 7, Jul. 1988, pp. 1180-1190.

Liu, D.L., et al., "Design of Large Embeddded CMOS PLA's for Built-In Self-test," IEEE Transactions on Computed-Aided Design, vol. 7, No. 1, Jan. 1988, pp. 50-53.

Sun, Y. et al., "An Area Minimizer for Floorplans with L-Shaped Regions," 1992 International Conference on Computer Design, 1992 IEEEE, pp. 383-386.

Minnick, R.C., "A Survey of Microcellular Research", vol. 14, No. 2, Apr. 1967, pp. 203-241.

Cliff et al., "A Dual Granularity and Globally Interconnected Architecture for a Programamble Logic Device", IEEE '93 pp. 7.3.1-7.3..5.
Xilinx, "The Programmble Gate Array Data Book", 1992.
Wescon '93, pp. 321-326.
Wescon '93, pp. 310-320.
Patent Abstracts of Japan, 11-330248, publication date Nov. 30, 1999.
Patent Abstracts of Japan, 03-139863, publication date Jun. 14, 1991.
Notice of the Reason for Refusal dated Feb. 23, 2010, Japanese patent Application No. 2008-129490, 2 pages.
Aggarwal, Aditya Kumar, "Routing Algorithms and Architectures for Hierarchical Field Programmable Gate Arrays," Thesis: Univ. of Toronto, Canada, Jan. 1994 (99 pages).
Chow, Paul et al., "A 1.2 μm CMOS FPGA Using Cascaded Logic Blocks and Segmented Routing," Department of Electrical Engineering, University of Toronto, Toronto, Ontario, Canada M5S 1A4 (12 pages).
Grunbacher, Herbert et al., "Field-Programmable Gate Arrays: Architectures and Tools for Rapid Prototyping," Springer-Verlag, from Second International Workshop on Field-Programmable Logic and Applications, Vienna, Austria, Aug. 31-Sep. 2, 1992 (10 pages).
Ikawa et al., "A One Day Chip: An Innovative IC Construction Approach Using Electrically REconfigurable Logic VLSI with On-Chip Programmable Interconnections," IEEE Journal of Solid State Physics, vol. SC-21, Apr. 1986, pp. 223-227.
Shoup, Richard G. "Programmable Cellular Logic Arrays," Computer Science Department, Carnegie-Mellon University, Mar. 1970.
Wahlstrom, Sven, "Programmable Logic Arrays-Cheaper by the Millions", Electronics, Dec. 11, 1967, pp. 90-95.
Xilinx "XC4000 Data Book, Logic Cell Array Family," Dec. 1991 (65 pages).
Xilinx "XC6200 Field Programmable Gate Arrays," Apr. 24, 1997, Version 1.10 (73 pages).
Zlotnick et al., "A High Performance Fine-Grained Approach to SRAM Based FPGAs," WESCON Conference Digest, Sep. 1993, pp. 321-326.
AIPLA's Model Patent Jury Instructions, American Property Law Association, 2005.
Copending U.S. Appl. No. 08/229,923, filed Apr. 14, 1994 entitled "Architecture and Interconnect Scheme for Programmable Logic Circuits," now abandoned.
Copending U.S. Appl. No. 08/484,922, filed Jun. 7, 1995 entitled "Architecture and Interconnect Scheme for Programmable Logic Circuits," now abandoned.
Kaptanoglu, Sinan et al., "A New High Density and Very Low Cost Reprogrammable FPGA Architecture," 1999, 10 pages, Actel Corporation.

* cited by examiner

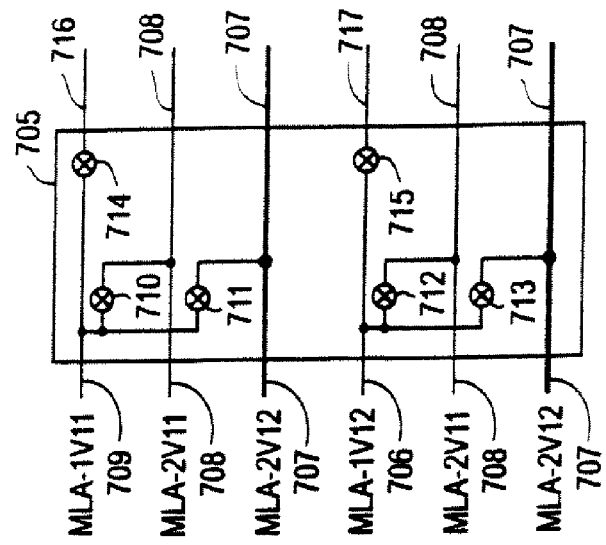
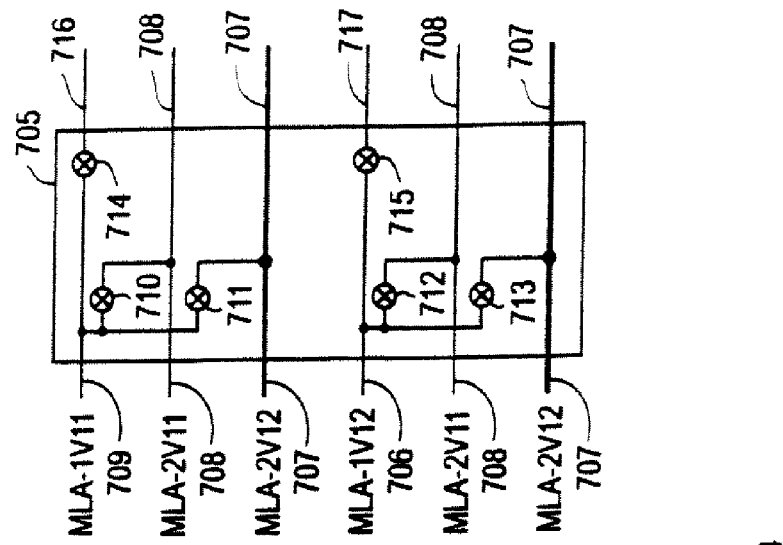
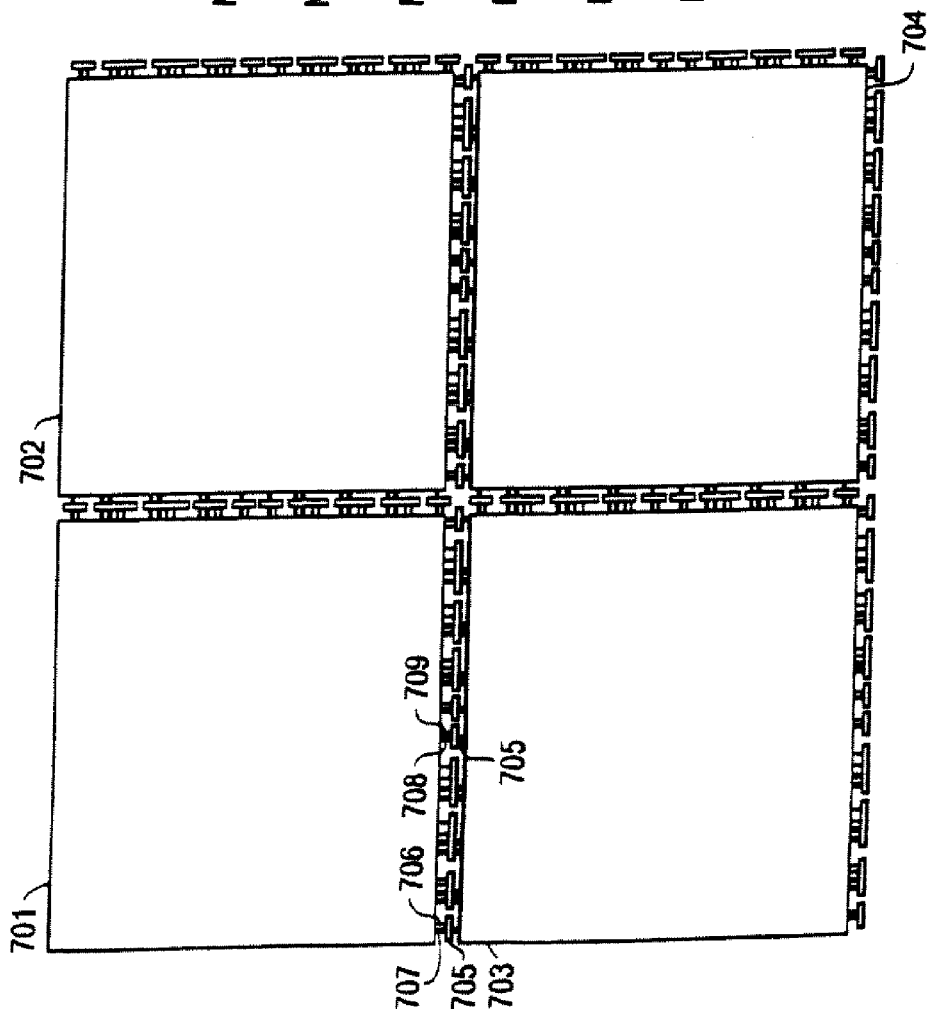

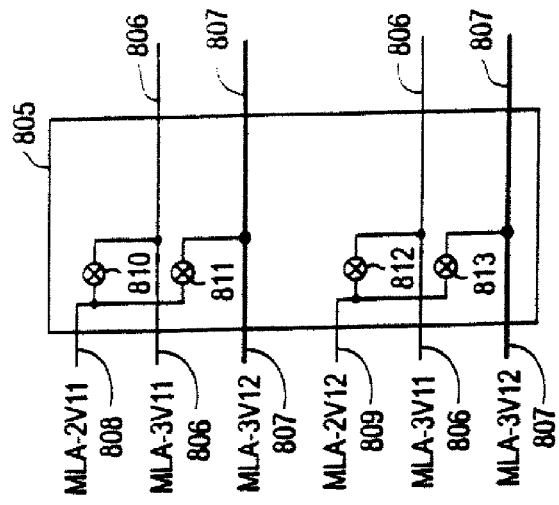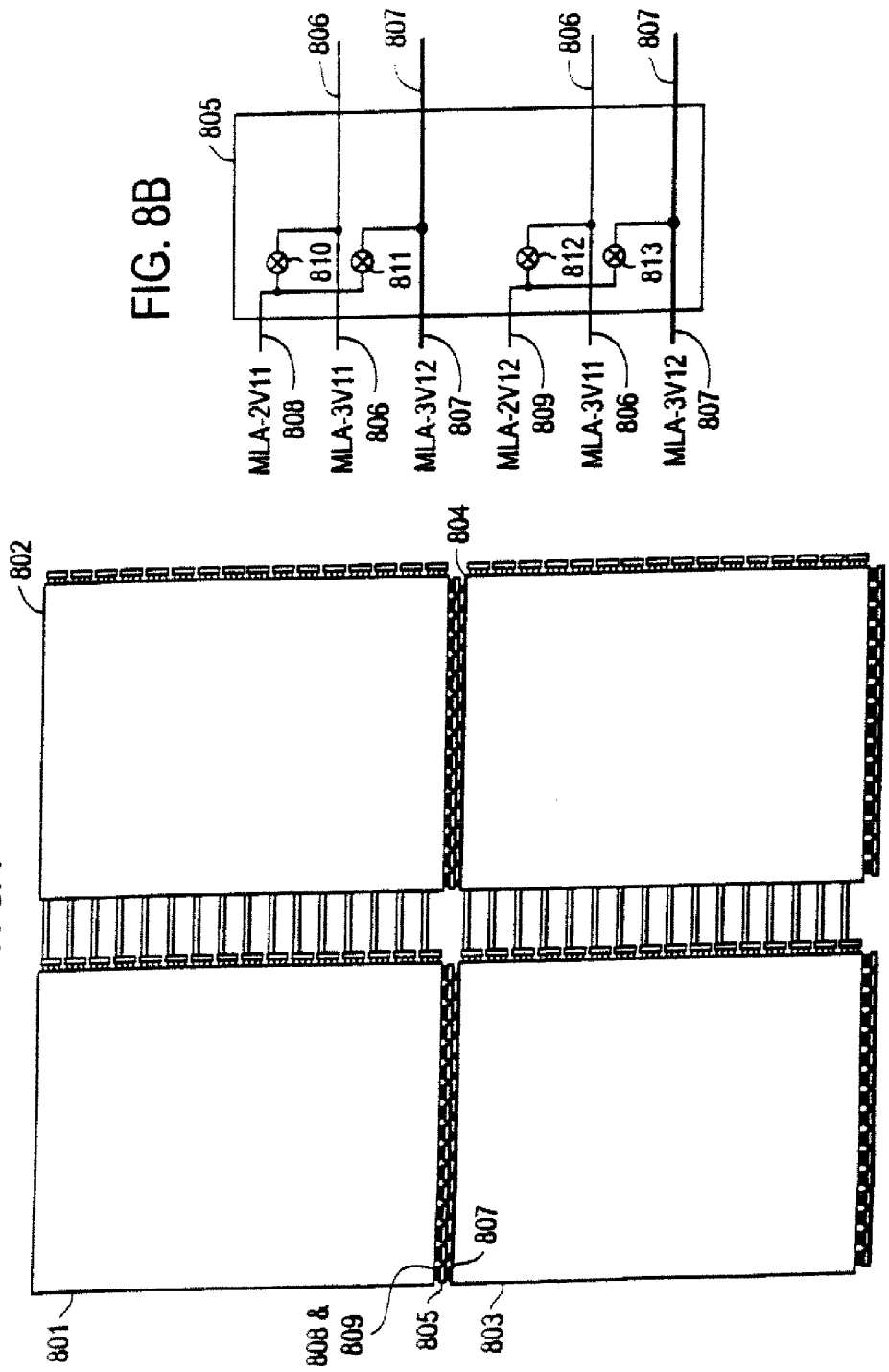

ARCHITECTURE AND INTERCONNECT SCHEME FOR PROGRAMMABLE LOGIC CIRCUITS

REFERENCE TO RELATED APPLICATIONS

This application is a continuation of application Ser. No. 12/630,679 filed Dec. 3, 2009, which is a continuation of application Ser. No. 12/215,118, now U.S. Pat. No. 7,646,218 filed Jun. 24, 2008, which is a continuation of application Ser. No. 11/299,248, now U.S. Pat. No. 7,409,664 filed Dec. 9, 2005, which is a continuation of application Ser. No. 10/692,880, now U.S. Pat. No. 7,017,136, filed Oct. 23, 2003, which is a continuation of application Ser. No. 10/269,364, now U.S. Pat. No. 6,703,861, filed Oct. 11, 2002, which is a continuation of application Ser. No. 09/955,589, now U.S. Pat. No. 6,507,217, filed Sep. 13, 2001, which is a continuation of application Ser. No. 09/034,769, now U.S. Pat. No. 6,433,580, filed Mar. 2, 1998, which is a continuation of application Ser. No. 08/484,922, filed Jun. 7, 1995, now abandoned, which is a continuation of application Ser. No. 08/101,197, now U.S. Pat. No. 5,457,410 filed Aug. 3, 1993, which are all herein incorporated by reference.

TECHNICAL FIELD

The present invention pertains to the field of programmable logic circuits. More particularly, the present invention relates to an architecture and interconnect scheme for programmable logic circuits.

BACKGROUND

When integrated circuits (ICs) were first introduced, they were extremely expensive and were limited in their functionality. Rapid strides in semiconductor technology have vastly reduced the cost while simultaneously increased the performance of IC chips. However, the design, layout, and fabrication process for a dedicated, custom built IC remains quite costly. This is especially true for those instances where only a small quantity of a custom designed IC is to be manufactured. Moreover, the turn-around time (i.e., the time from initial design to a finished product) can frequently be quite lengthy, especially for complex circuit designs. For electronic and computer products, it is critical to be the first to market. Furthermore, for custom ICs, it is rather difficult to effect changes to the initial design. It takes time, effort, and money to make any necessary changes.

In view of the shortcomings associated with custom IC's, field programmable gate arrays (FPGAs) offer an attractive solution in many instances. Basically, FPGAs are standard, high-density, off-the-shelf ICs which can be programmed by the user to a desired configuration. Circuit designers first define the desired logic functions, and the FPGA is programmed to process the input signals accordingly. Thereby, FPGA implementations can be designed, verified, and revised in a quick and efficient manner. Depending on the logic density requirements and production volumes, FPGAs are superior alternatives in terms of cost and time-to-market.

A typical FPGA essentially consists of an outer ring of I/O blocks surrounding an interior matrix of configurable logic blocks. The I/O blocks residing on the periphery of an FPGA are user programmable, such that each block can be programmed independently to be an input or an output and can also be tri-statable. Each logic block typically contains programmable combinatorial logic and storage registers. The combinatorial logic is used to perform boolean functions on its input variables. Often, the registers are loaded directly from a logic block input, or they can be loaded from the combinatorial logic.

Interconnect resources occupy the channels between the rows and columns of the matrix of logic blocks and also between the logic blocks and the I/O blocks. These interconnect resources provide the flexibility to control the interconnection between two designated points on the chip. Usually, a metal network of lines run horizontally and vertically in the rows and columns between the logic blocks. Programmable switches connect the inputs and outputs of the logic blocks and I/O blocks to these metal lines. Crosspoint switches and interchanges at the intersections of rows and columns are used to switch signals from one line to another. Often, long lines are used to run the entire length and/or breadth of the chip.

The functions of the I/O blocks, logic blocks, and their respective interconnections are all programmable. Typically, these functions are controlled by a configuration program stored in an on-chip memory. The configuration program is loaded automatically from an external memory upon power-up, on command, or programmed by a microprocessor as part of system initialization.

The concept of FPGA was summarized in the sixty's by Minnick who described the concept of cell and cellular array as reconfigurable devices in the following documents: Minnick, R. C. and Short, R. A., "Cellular Linear-Input Logic, Final Report," SRI Project 4122, Contract AF 19(628)-498, Stanford Research Institute, Menlo Park, Calif., AFCRL 64-6 DDC No. AD 433802 (February 1964); Minnick, R. C., "Cobweb Cellular Arrays," Proceedings AFIPS 1965 Fall Joint Computer Conference, Vol. 27, Part 1 pp. 327-341 (1965); Minnick, R. C. et al., "Cellular Logic, Final Report," SRI Project 5087, Contract AF 19(628)-4233, Stanford Research Institute, Menlo Park, Calif., AFCRL 66-613, (April 1966); and Minnick, R. C., "A Survey of Microcellular Research," Journal of the Association for Computing Machinery, Vol. 14, No. 2, pp. 203-241 (April 1967). In addition to memory based (e.g., RAM-based, fuse-based, or antifuse-based) means of enabling interconnects between devices, Minnick also discussed both direct connections between neighboring cells and use of busing as another routing technique. The article by Spandorfer, L. M., "Synthesis of Logic Function on an Array of Integrated Circuits," Stanford Research Institute, Menlo Park, Calif., Contract AF 19(628) 2907, AFCRL 64-6, DDC No. AD 433802 (November 1965), discussed the use of complementary MOS bi-directional passgate as a means of switching between two interconnect lines that can be programmed through memory means and adjacent neighboring cell interconnections. In Wahlstrom, S. E., "Programmable Logic Arrays—Cheaper by the Millions," Electronics, Vol. 40, No. 25, 11, pp. 90-95 (December 1967), a RAM-based, reconfigurable logic array of a two-dimensional array of identical cells with both direct connections between adjacent cells and a network of data buses is described.

Shoup, R. G., "Programmable Cellular Logic Arrays," Ph.D. dissertation, Carnegie-Mellon University, Pittsburgh, Pa. (March 1970), discussed programmable cellular logic arrays and reiterates many of the same concepts and terminology of Minnick and recapitulates the array of Wahlstrom. In Shoup's thesis, the concept of neighbor connections extends from the simple 2-input 1-output nearest-neighbor connections to the 8-neighbor 2-way connections. Shoup further described use of bus as part of the interconnection structure to improve the power and flexibility of an array. Buses can be used to route signals over distances too long, or in inconvenient directions, for ordinary neighbor connections. This is particularly useful in passing inputs and outputs from outside the array to interior cells.

U.S. Pat. No. 4,020,469 discussed a programmable logic array that can program, test, and repair itself. U.S. Pat. No. 4,870,302 introduced a coarse grain architecture without use of neighbor direct interconnections where all the programmed connections are through the use of three different sets of buses in a channeled architecture. The coarse grain cell (called a Configurable Logical block or CLB) contains both RAM-based logic table look up combinational logic and flip flops inside the CLB where a user defined logic must be mapped into the functions available inside the CLB. U.S. Pat. No. 4,935,734 introduced a simple logic function cell defined as a NAND, NOR or similar types of simple logic function inside each cell. The interconnection scheme is through direct neighbor and directional bus connections. U.S. Pat. Nos. 4,700,187 and 4,918,440 defined a more complex logic function cell where an Exclusive OR and AND functions and a register bit is available and selectable within the cell. The preferred connection scheme is through direct neighbor connections. Use of bi-direction buses as connections were also included.

Current FPGA technology has a few shortcomings. These problems are embodied by the low level of circuit utilization given the vast number of transistors available on chip provided by the manufacturers. Circuit utilization is influenced by three factors. The first one at the transistor or fine grain cell level is the function and flexibility of the basic logic element that can be readily used by the users. The second one is the ease in which to form meaningful macro logic functions using the first logic elements with minimum waste of circuit area. The last factor is the interconnections of those macro logic functions to implement chip level design efficiently. The fine grained cell architectures such as those described above, provided easily usable and flexible logical functions for designers at the base logic element level.

However, for dense and complex macro functions and chip level routing, the interconnection resources required to connect a large number of signals from output of a cell to the input(s) of other cells can be quickly exhausted, and adding these resources can be very expensive in terms of silicon area. As a consequence, in fine grained architecture design, most of the cells are either left unused due to inaccessibility, or the cells are used as interconnect wires instead of logic. This adds greatly to routing delays in addition to low logic utilization, or excessive amount of routing resources are added, greatly increasing the circuit size. The coarse grain architecture coupled with extensive routing buses allows significant improvements for signals connecting outputs of a CLB to inputs of other CLBs. The utilization at the CLB interconnect level is high. However, the difficulty is the partitioning and mapping of complex logic functions so as to exactly fit into the CLBs. If a part of logic inside the CLB is left unused, then the utilization (effective number of gates per unit area used) inside the CLB can be low.

Another problem with prior art FPGAs is due to the fact that typically a fixed number of inputs and a fixed number of outputs are provided for each logic block. If, by happenstance, all the outputs of a particular logic block is used up, then the rest of that logic block becomes useless.

Therefore, there is a need in prior art FPGAs for a new architecture that will maximize the utilization of an FPGA while minimizing any impact on the die size. The new architecture should provide flexibility in the lowest logic element level in terms of functionality and flexibility of use by users, high density per unit area functionality at the macro level where users can readily form complex logic functions with the base logic elements, and finally high percentage of interconnectability with a hierarchical, uniformly distributed routing network for signals connecting macros and base logic elements at the chip level. Furthermore, the new architecture should provide users with the flexibility of having the number of inputs and outputs for individual logical block be selectable and programmable, and a scalable architecture to accommodate a range of FPGA sizes.

BRIEF DESCRIPTION OF THE DRAWINGS

The present invention is illustrated by way of example, and not by way of limitation, in the figures of the accompanying drawings and in which like reference numerals refer to similar elements and in which:

FIG. 7A shows the block diagram of a block sector.

FIG. 7B shows a level 1 to level 2 MLA routing exchange network.

FIG. 8A shows a sector cluster.

FIG. 8B shows a level 2 to level 3 MLA routing exchange network.

DETAILED DESCRIPTION

An architecture and interconnect scheme for programmable logic circuits is described. In the following description, for purposes of explanation, numerous specific details are set forth, such as combinational logic, cell configuration, numbers of cells, etc., in order to provide a thorough understanding of the present invention. It will be obvious, however, to one skilled in the art that the present invention may be practiced without these specific details. In other instances, well-known structures and devices are shown in block diagram form in order to avoid unnecessarily obscuring the present invention. It should also be noted that the present invention pertains to a variety of processes including but not limited to static random access memory (SRAM), dynamic random access memory (DRAM), fuse, anti-fuse, erasable programmable read only memory (EPROM), electrically erasable programmable read only memory (EEPROM), FLASH, and ferroelectric processes.

Figure 1:
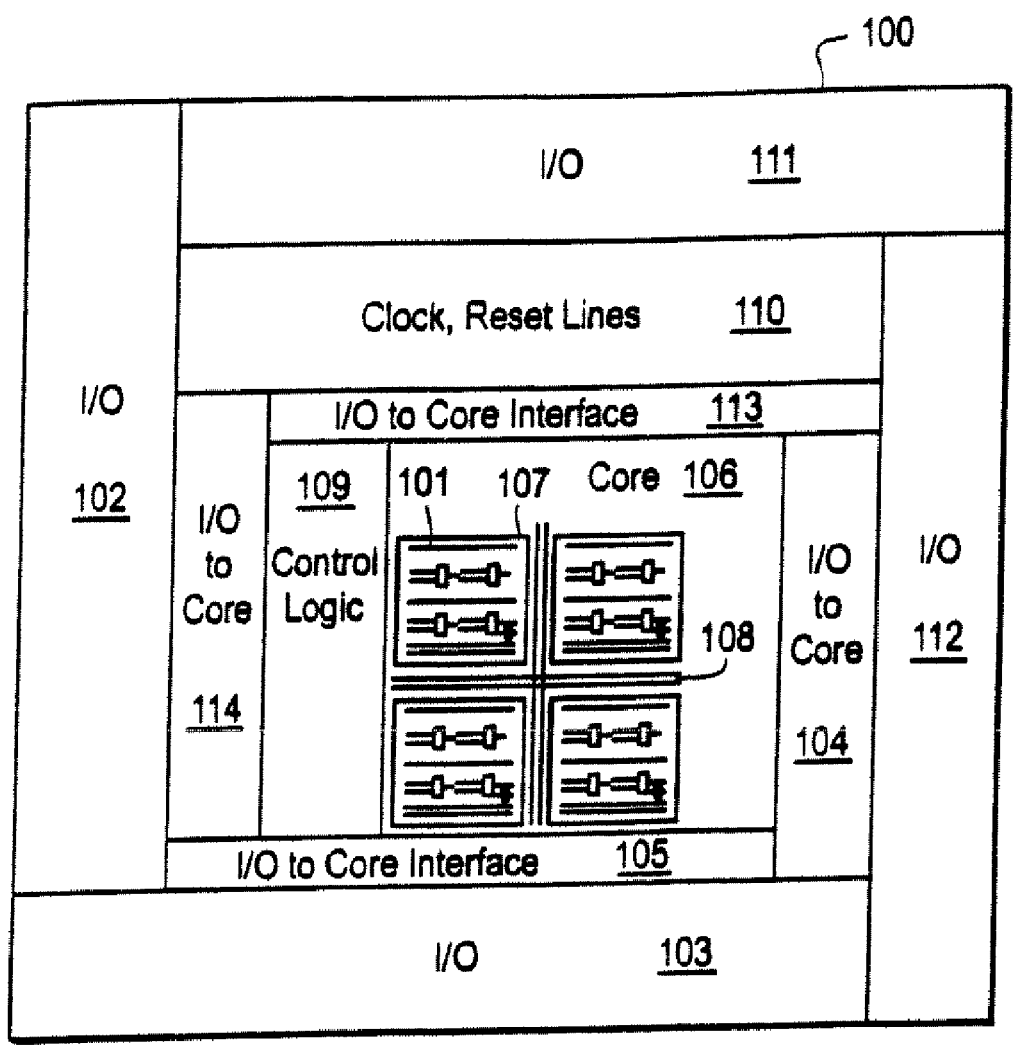
FIG. 1 is a block diagram of a field programmable gate array logic upon which the present invention may be practiced.

Referring to FIG. 1, a block diagram of a field programmable gate array logic upon which the present invention may be practiced is shown as 100. The I/O logical blocks 102, 103, 111 and 112 provide an interface between external package pins of the FPGA and the internal user logic either directly or through the I/O to Core interface 104, 105, 113, and 114. Four interface blocks 104, 105, 113, and 114 provide decoupling between core 106 and the I/O logic 102, 103, 111, and 112. Core 106 is comprised of a number of clusters 107 which are intraconnected by I-Matrix 101 and interconnected by MLA routing network 108.

Control/programming logic 109 is used to control all of the bits for programming the bit and word lines. For anti-fuse or fuse technology, high voltage/current is applied to either zap or connect a fuse. For EEPROM, Flash, or ferroelectric technology, there is an erase cycle followed by a programming cycle for programming the logic states of the memory bits. In order to minimize skewing, a separate clock/reset logic 110 is used to provide clock and reset lines on a group basis.

Figure 2B:
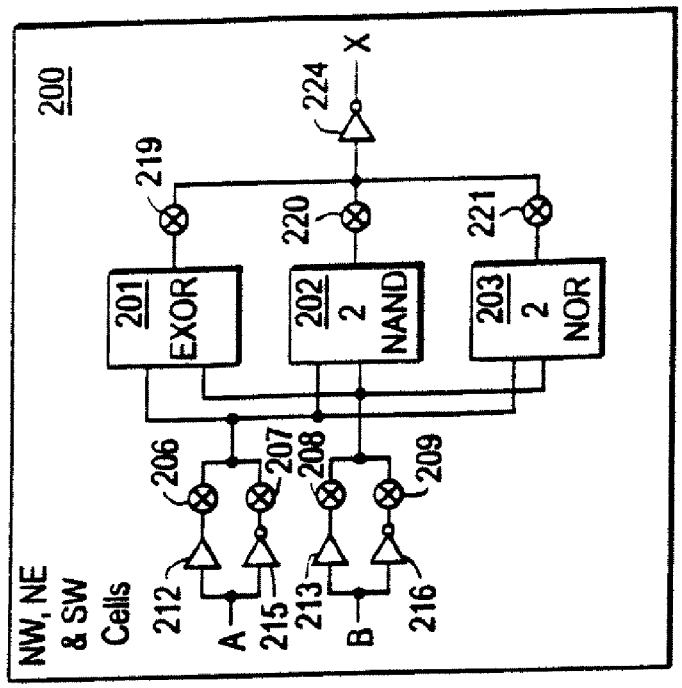
FIG. 2B shows another example of an individual cell.
Figure 2A:
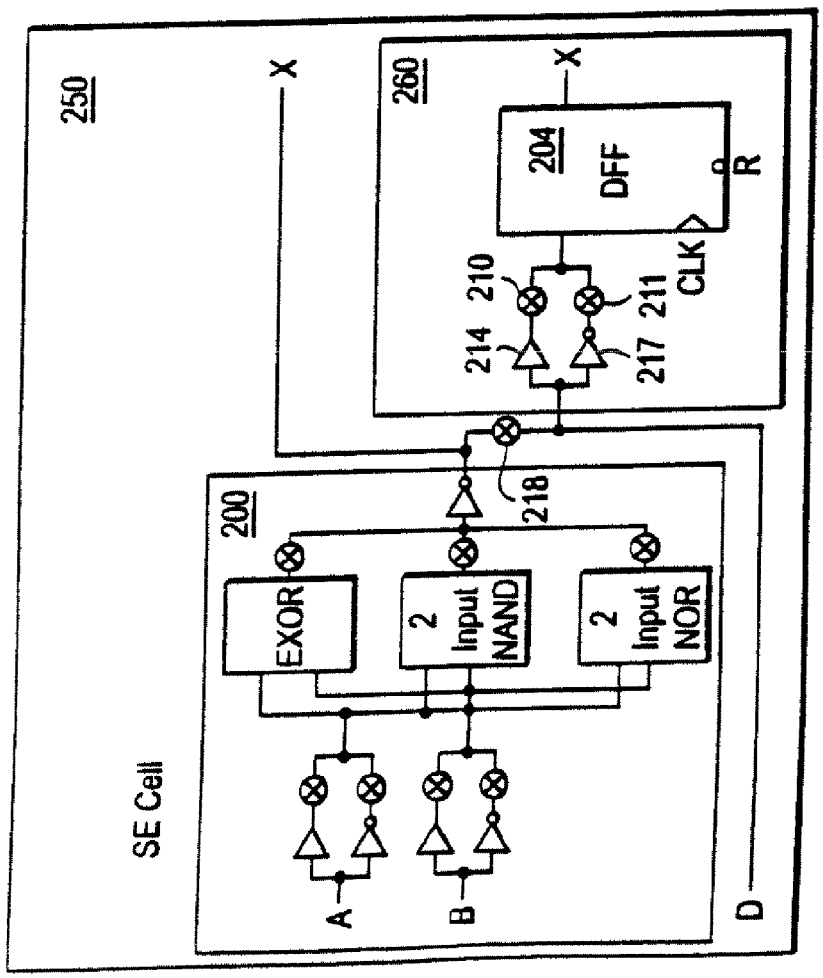
FIG. 2A shows one example of an individual cell.

In the currently preferred embodiment, each of the clusters 107 is comprised of a 2×2 hierarchy of four cells, called a logical cluster. FIGS. 2A and 2B show examples of individual cells 200 and 250. Cell 200 performs multiple logic functions on two input signals (A and B) and provides an output signal X. In the currently preferred embodiment, cell 200 is comprised of an XOR gate 201, a two-input NAND gate 202, and a two-input NOR gate 203. It should be noted, however, that in other embodiments, cell 200 can include various other types and/or combinations of gates. Cell 250 is comprised of cell 200 coupled with a D flip flop cell 260. The output X of cell 200 can be programmed to connect directly to the data input D of the D flip flop gate 204 by activating switch 218. The data input D can be accessed as a third input of the combined cell 250. Each of the two input signals A and B and the D input of D flip-flop can be inverted or non-inverted, depending on the states of switches 206-211. Activating switches 206, 208 and 210 causes signals A, B and D to be driven by drivers 212-214 to gates 201-204 in a non-inverted fashion. Activating switches 207, 209, and 211 causes the input signals A, B and D to be inverted by inverters 215-217 before being passed to gates 201-204. The six switches 212-217 can individually be turned on and off as programmed by the user.

Note that the XOR gate 201, NAND gate 202, and NOR gate 203 can also be used to perform XNOR, AND and OR by propagating the output signal to the next stage, whereby the signal can be inverted as discussed above.

Three switches 219-221 are respectively coupled to the outputs of the three gates 201-203. Again, these switches are programmable by the user. Thereby, the user can specify which of the outputs from the gates 201-203 is to be sent to driver 224 as the output X from cell 200.

The aforementioned switches 206-211, 218-221 are comprised of bi-directional, program-controlled passgates. Depending on the state of the control signal, the switches are either conducting (i.e. passes a signal on the line) or non-conducting (i.e. does not pass the signal on the line). Switches mentioned in the following sections are similarly comprised of program-controlled passgates.

Figure 3A:
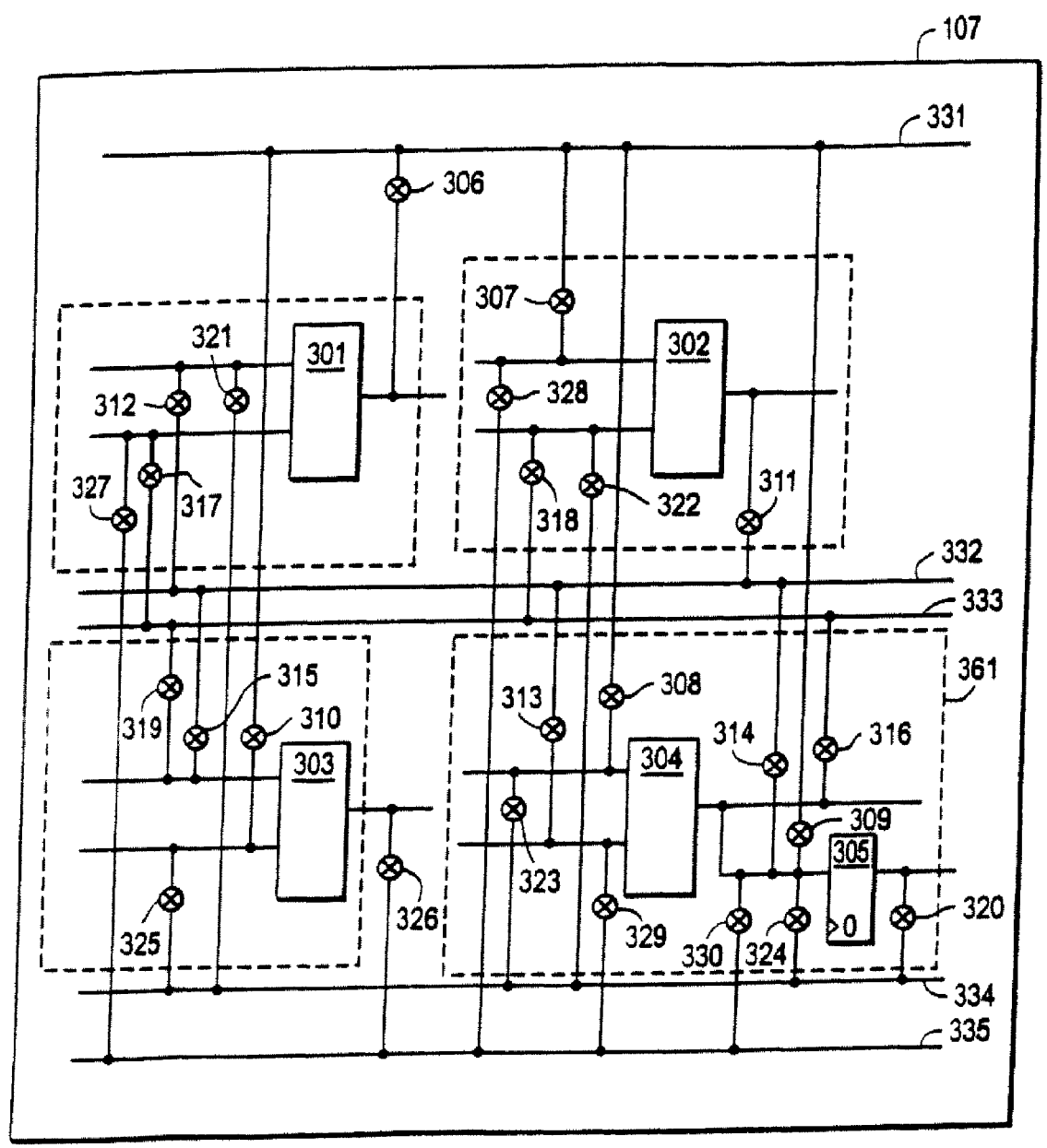
FIG. 3A shows a logical cluster.

Referring now to FIG. 3A, a logical cluster 107 is shown. In the currently preferred embodiment, logical cluster 107 is comprised of four cells 301-304 and a D flip-flop 305, twenty five switches 306-330, and five intraconnection lines 331-335. D flip flop 305 and cell 304 form a cell 361, such as cell 250 described with respect to FIG. 2a. The Intraconnection lines 331-335 and switches 306-330 form the I-Matrix. I-Matrix provide connectability of the output, X, of each of the four cells 301-304, and the output X of the D flip-flop 305 to at least one input of each of the other three cells and the D flip-flop. For example, the output X of cell 301 can be connected to input A of cell 302 by enabling switches 306 and 307. Likewise, the output X of cell 301 can be connected to input B of cell 303 by enabling switches 306 and 310. Output X of cell 301 can be connected to input A of cell 304 by enabling switches 306 and 308. Output X of cell 301 can be connected to input D of the D flip-flop cell 305 by enabling switches 306 and 309.

Similarly, the output X from cell 302 can be connected to input A of cell 301 by enabling switches 311 and 312. The output X from cell 302 can be connected to input A of cell 303 by enabling switches 311 and 315. The output X from cell 302 can be connected to input B of cell 304 by enabling switches 311 and 313. Output X of cell 302 can be connected to input D of the D flip-flop cell 305 by enabling switches 311 and 314.

Similarly, the output X from cell 303 can be connected to input B of cell 301 by enabling switches 326 and 327. The output X from cell 303 can be connected to input A of cell 302 by enabling switches 326 and 328. The output X from cell 303 can be connected to input B of cell 304 by enabling switches 326 and 329. Output X of cell 303 can be connected to input D of the D flip-flop cell 305 by enabling switches 326 and 330.

For cell 304, the output X from cell 304 can be connected to input B of cell 301 by enabling switches 316 and 317. The output X from cell 304 can be connected to input B of cell 302 by enabling switches 316 and 318. The output X from cell 304 can be connected to input A of cell 303 by enabling switches 316 and 319. Output X of cell 304 can be programmably connected to input D of the D flip-flop cell 305 by enabling switch 218 in FIG. 2A.

With respect to cell 305, its output is connectable to the A input of cell 301 by enabling switches 320 and 321; the B input of cell 302 by enabling switches 320 and 322; the B input of cell 303 by enabling switches 320 and 325; the A input of cell 304 by enabling switches 320 and 323; and the D input of cell 305 itself by enabling switches 320 and 324.

It can be seen that each output of the cells 301-304 and of the D flip-flop 305 is connectable to the input of each of its neighboring cells and/or flip-flop inside the cluster.

Figure 3B:
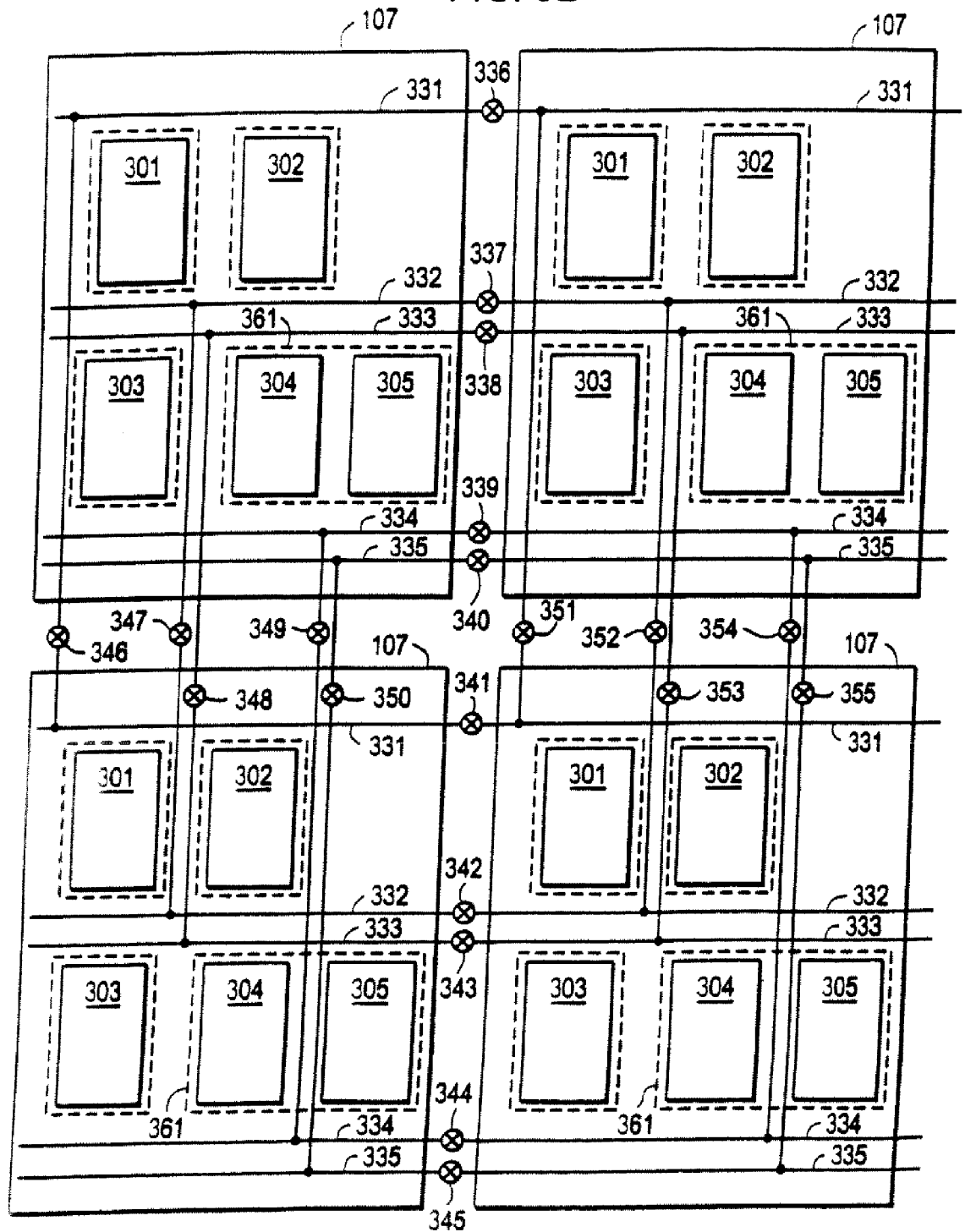
FIG. 3B shows the extension of I-matrix intraconnections of a logical cluster to a neighboring logical cluster.

In the currently preferred embodiment of the present invention, each logical cluster is connectable to all the other logical clusters inside each logical block through passgate switches extending the I-Matrix from neighboring clusters inside each logical block. FIG. 3B illustrates the extension of I-Matrix intraconnection lines 331-335 of the cells 301-304 and the D flip-flop 305 of a logical cluster 107 to a neighboring logical cluster 107 through the passgate switches 336-355 within the same logical block.

In the currently preferred embodiment of the present invention, each logical block is connectable to all the other logical blocks of the FPGA. This is accomplished by implementing an architecture with multiple layers of interconnections. It is important to note that this multiple layers routing architecture is a conceptual hierarchy, not a process or technology hierarchy and is hence readily implementable with today's silicon process technology. The bottom most layer of interconnections is referred to as the "block connectors". A set of block connectors provides the access and interconnections of signals within an associated logical block (which is consisted of four logical clusters or 16 cells). Thereby, different sets of logical clusters within the same logical block are connectable to any of the other logical clusters within that group through the use of extended I-Matrix and/or block connectors. Again, programmable bi-directional passgates are used as switches to provide routing flexibility to the user.

The next level of connections is referred to as the "level 1 Multiple Level Architecture (MLA)" routing network. The level 1 MLA routing network provides the interconnections between several sets of block connectors. Programmable passgates switches are used to provide users with the capability of selecting which of the block connectors are to be connected. Consequently, a first logical block from one set of logical block groups is connectable to a second logical block belonging to the same group. The appropriate switches are enabled to connect the block connectors of the first logical block to the routing lines of the level 1 MLA routing network. The appropriate switches of the level 1 MLA routing network are enabled to provide the connections to the block connectors of the second logical block to the routing lines of the level 1 MLA routing network. The appropriate switches are enabled to connect the routing lines of the level 1 MLA routing network that connected to the block connectors of the first and the second logical blocks. Furthermore, the user has the additional flexibility of programming the various switches within any given logical block to effect the desired intraconnections between each of the cells of any logical block.

The next level of connections is referred to as the "level 2 Multiple Level Architecture (MLA)" routing network. The level 2 MLA provides the interconnections to the various level 1 MLA to effect access and connections of a block cluster. Again, bi-directional passgate switches are programmed by the user to effect the desired connections. By implementing level 2 MLA routing network, programmable interconnections between even larger numbers of logical blocks is achieved.

Additional levels of MLA routing networks can be implemented to provide programmable interconnections for ever increasing numbers and groups of logical blocks, block clusters, block sectors, etc. Basically, the present invention takes a three dimensional approach for implementing routing. Signals are routed amongst the intraconnections of a logical block. These signals can then be accessed through block connectors and routed according to the programmed connections of the block connectors. If needed, signals are "elevated" to the level 1 MLA, routed through the level 1 MLA routing network, "de-elevated" to the appropriate block connectors, and then passed to the destination logical block.

If level 2 MLA routing network is required, some of the signals are elevated a second time from a level 1 MLA routing network line to the level 2 MLA routing network, routed to a different set of level 2 MLA routing network line, and "de-elevated" from the level 2 MLA routing network line to a Level 1 MLA routing network line. Thereupon, the signals are "de-elevated" a second time to pass the signal from the level 1 MLA to the appropriate block connectors of the destination logical block. This same approach is performed for level 3, 4, 5, etc. MLAs on an as needed basis, depending on the size and density of the FPGA. Partial level n MLA can be implemented using the above discussed method to implement a FPGA with a given cell array count.

Figure 4A:
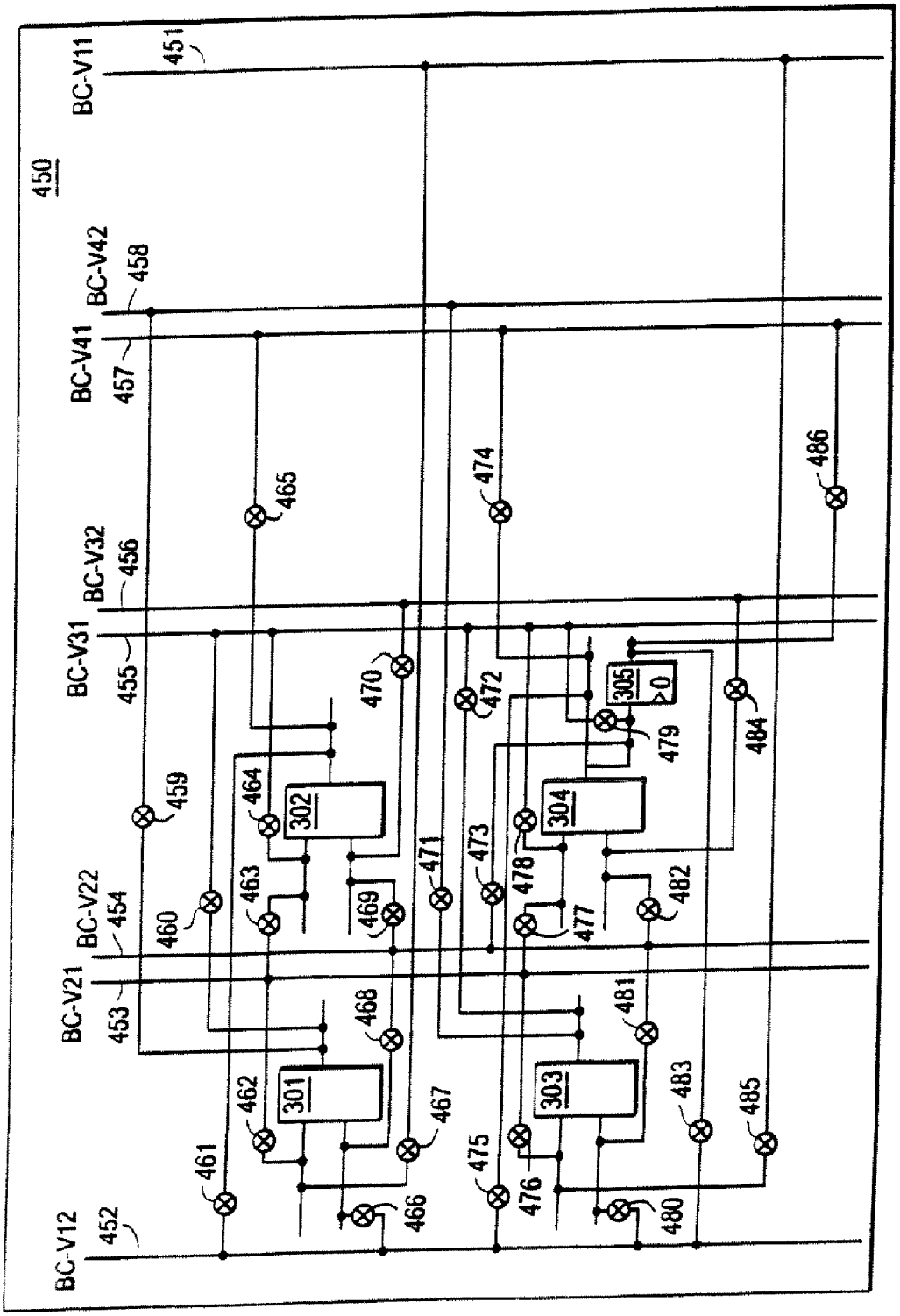
FIG. 4A shows an example of a logical cluster with vertical block connectors.

FIG. 4A shows an example of a logical cluster and the associated vertical block connectors within the logical block. In the currently preferred embodiment, each cell in a logical cluster is accessible from the input by two vertical block connectors and each output of the cell in a logical cluster is accessible to two of the vertical block connectors. For example, input A of cell 301 is accessible to the vertical block connectors 451 (BC-V11) and 453 (BC-V21) through switches 467, 462 respectively, input B of cell 301 is accessible to the vertical block connectors 452 (BC-V12) and 454 (BC-V22) through switches 466, 468 respectively, output X of cell 301 is accessible to the vertical block connectors 455 (BC-V31) and 458 (BC-V42) through switches 460, 459 respectively. Input A of cell 302 is accessible to the vertical block connectors 453 (BC-V21) and 455 (BC-V31) through switches 463, 464 respectively, input B of cell 302 is accessible to the vertical block connectors 454 (BC-V22) and 456 (BC-V32) through switches 469, 470 respectively, output X of cell 302 is accessible to the vertical block connectors 452 (BC-V12) and 457 (BC-V41) through switches 461, 465 respectively. Input A of cell 303 is accessible to the vertical block connectors 451 (BC-V11) and 453 (BC-V21) through switches 485, 476 respectively, input B of cell 303 is accessible to the vertical block connectors 452 (BC-V12) and 454 (BC-V22) through switches 480, 476 respectively, output X of cell 303 is accessible to the vertical block connectors 455 (BC-V31) and 458 (BC-V42) through switches 472, 471 respectively. The input A of cell 304 is accessible to the vertical block connectors 453 (BC-V21) and 455 (BC-V31) through switches 477, 478 respectively, input B of cell 304 is accessible to the vertical block connectors 454 (BC-V22) and 456 (BC-V32) through switches 482, 484 respectively, output X of cell 304 is accessible to the vertical block connectors 452 (BC-V12) and 457 (BC-V41) through switches 475, 474 respectively. D flip-flop cell 305 input is accessible to the vertical block connectors 454 (BC-V22) and 455 (BC-V31) through switches 473, 479 respectively, output X of cell 305 is accessible to the vertical block connectors 452 (BC-V12) and 457 (BC-V41) through switches 483, 486 respectively.

Figure 4B:
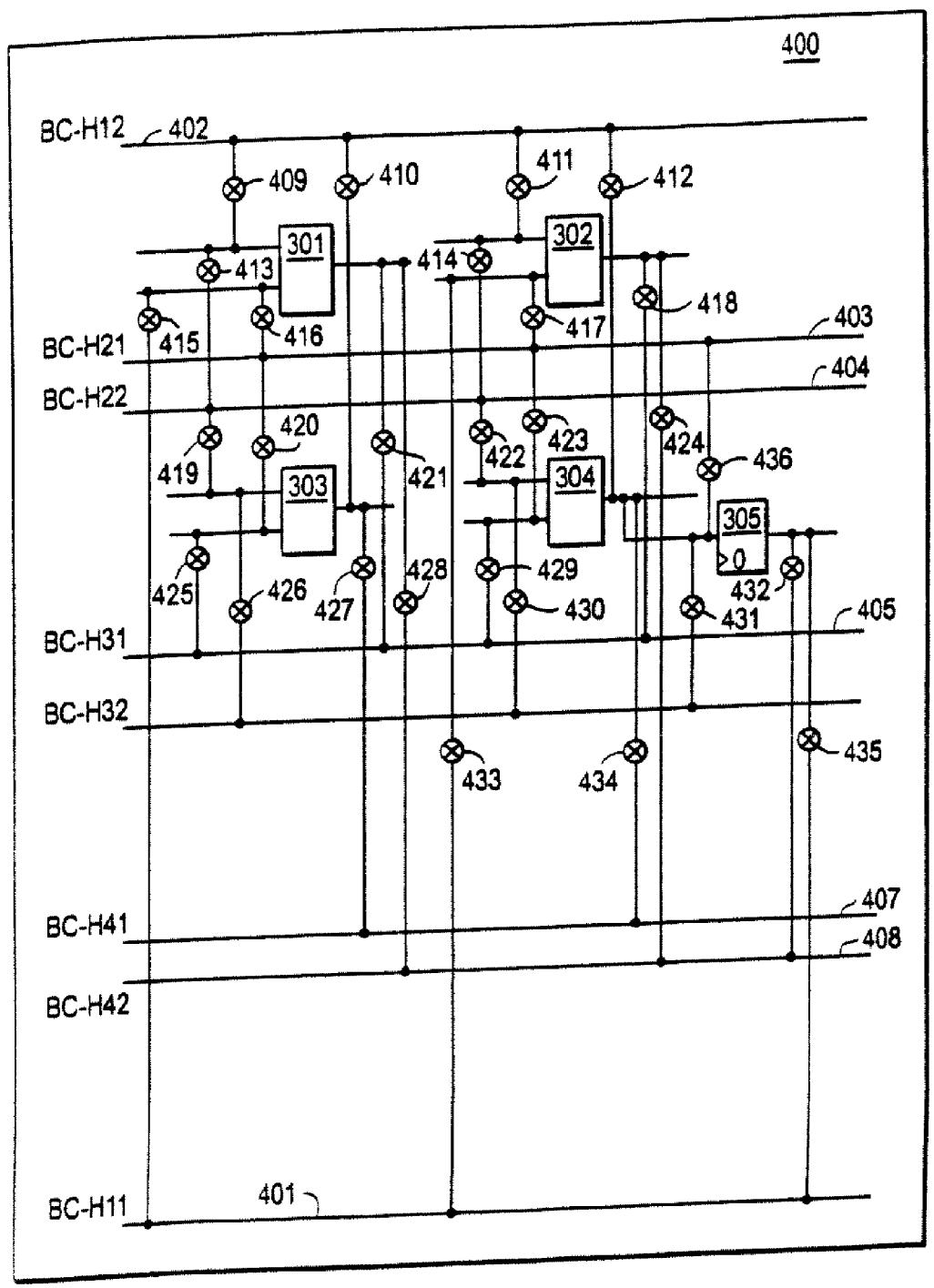
FIG. 4B shows an example of a logical cluster with horizontal block connectors.

In similar fashion, FIG. 4B shows the possible connections corresponding to horizontal block connectors and the logical cluster shown in FIG. 4A. Input A of cell 301 is accessible to the horizontal block connectors 402 (BC-H12) and 404 (BC-H22) through switches 409, 413 respectively, input B of cell 301 is accessible to the horizontal block connectors 401 (BC-H11) and 403 (BC-H21) through switches 415, 416 respectively, output X of cell 301 is accessible to the horizontal block connectors 405 (BC-H31) and 408 (BC-H42) through switches 421, 428 respectively. Input A of cell 302 is accessible to the horizontal block connectors 402 (BC-H12) and 404 (BC-H22) through switches 411, 414 respectively, input B of cell 302 is accessible to the horizontal block connectors 401 (BC-H11) and 403 (BC-H21) through switches 433, 417 respectively, output X of cell 302 is accessible to the horizontal block connectors 405 (BC-H31) and 408 (BC-H42) through switches 418, 424 respectively. Input A of cell 303 is accessible to the horizontal block connectors 404 (BC-H22) and 406 (BC-H32) through switches 419, 426 respectively, input B of cell 303 is accessible to the horizontal block connectors 403 (BC-H21) and 405 (BC-H31) through switches 420, 425 respectively, output X of cell 303 is accessible to the horizontal block connectors 402 (BC-H12) and 407 (BC-H41) through switches 410, 427 respectively. The input A of cell 304 is accessible to the horizontal block connectors 404 (BC-H22) and 406 (BC-H32) through switches 422, 430 respectively, input B of cell 304 is accessible to the horizontal block connectors 403 (BC-H21) and 405 (BC-H31) through switches 423, 429 respectively, output X of cell 304 is accessible to the horizontal block connectors 402 (BC-H12) and 407 (BC-H41) through switches 412, 434 respectively. D flip-flop cell 305 input is accessible to the horizontal block connectors 403 (BC-H21) and 406 (BC-H32) through switches 436, 431 respectively, output X of cell 305 is accessible to the horizontal block connectors 401 (BC-H11) and 408 (BC-H42) through switches 432, 435 respectively.

FIGS. 4A and 4B illustrate the vertical and horizontal block connectors accessing method to the upper left (NW) logical cluster inside a logical block in the currently preferred embodiment. The lower left (SW) cluster has the identical accessing method to the vertical block connectors as those of the NW cluster. The upper right (NE) cluster has similar accessing method to those of the NW cluster with respect to the vertical block connectors except the sequence of vertical block connector access is shifted. The vertical block connectors 451-458 can be viewed as chained together as a cylinder (451, 452, ..., 458). Any shift, say by 4, forms a new sequence: (455, 456, 457, 458, 451, 452, 453, 454). Instead of starting with vertical block connectors 451 and 453 accessing by cell 301 in the NW cluster as illustrated in FIGS. 4A, the cell 301 in the NE cluster is accessible to VBCs 455 and 457. The numbering is "shifted" by four. The access labeling of the lower right (SE) cluster to the VBCs is identical to those of NE cluster.

Similarly, the horizontal block connectors access to the NW cluster is identical to those of the NE cluster and the SW cluster is identical to the SE cluster while the horizontal block connectors access to the SW cluster is shifted by four compared with those of NW cluster.

In the currently preferred embodiment, sixteen block connectors are used per logical block (i.e. four clusters, or a 4×4 cell array). Adding a level 1 MLA routing network allows for the connectability for a block cluster (an 8×8 cell array). Adding level 2 MLA routing network increases the connectability to a block sector (16×16 cell array). Additional levels of MLA routing network increases the number of block sectors by factors of four while the length (or reach) of each line in the MLA routing network increases by factors of two. The number of routing lines in the level 2 MLA is increased by a factor of two; since the number of block sectors increased by a factor of four, on a per unit area basis, the number of routing lines in the next level of hierarchy actually decreases by a factor of two.

Figure 5A:
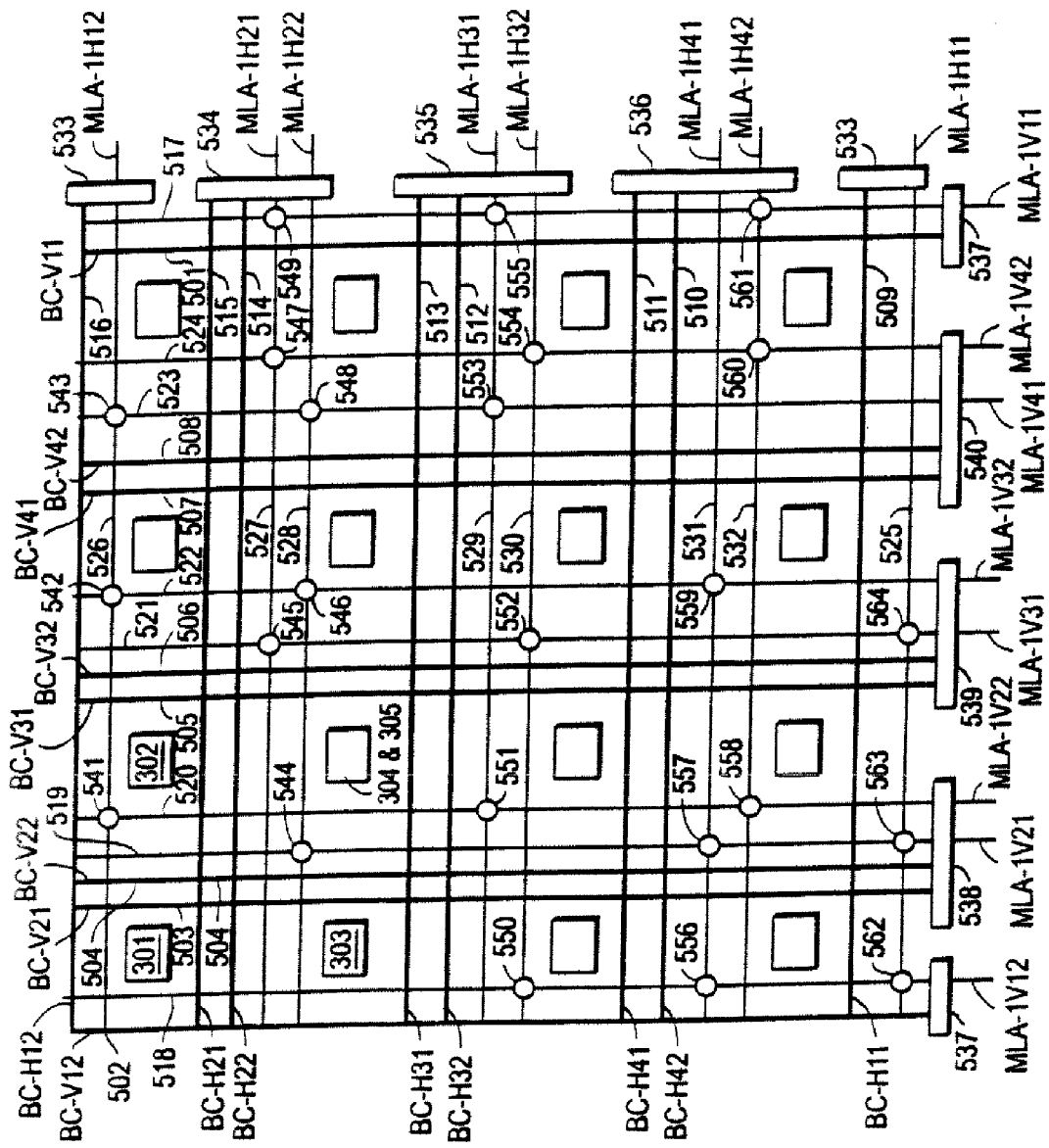
FIG. 5A shows the eight block connector to level 1 MLA exchange networks associated with a logical block and level 1 MLA turn points.

FIG. 5A shows a logical block with associated sixteen block connectors and level 1 MLA routing lines associated with the logical block. The sixteen block connectors 501-516 are depicted by heavy lines whereas the sixteen level 1 MLA routing network lines 517-532 are depicted by lighter lines. Note that the length or span of the block connectors terminates within the logical block while the length of the level 1 MLA routing network lines extends to neighboring logical blocks (twice the length of the block connectors).

Both block connectors and level 1 MLA routing network lines are subdivided into horizontal and vertical groups: vertical block connectors 501-508, horizontal block connectors 509-516, vertical level 1 MLA routing network lines 517-524, and horizontal level 1 MLA routing network lines 525-532.

Figure 5B:
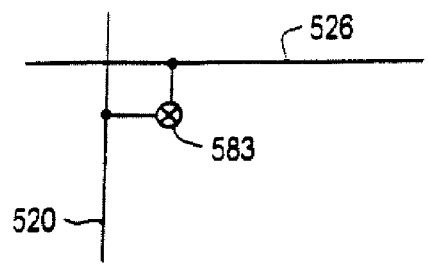
FIG. 5B shows a level 1 MLA turn point.

In the currently preferred embodiment, there are twenty four level 1 MLA turn points for the sixteen level 1 MLA routing network lines within the logical block. In FIG. 5A, the twenty four turn points are depicted as clear dots 541-564. A MLA turn point is a programmable bi-directional passgate for providing connectability between a horizontal MLA routing network line and a vertical MLA routing network line. For example, enabling level 1 MLA turn point 541 causes the horizontal level 1 MLA routing network line 526 and vertical level 1 MLA routing network line 520 to become connected together. FIG. 5B shows level 1 MLA turn point 541. Switch 583 controls whether level 1 MLA routing network line 526 is to be connected to level 1 MLA routing network line 520. If switch is enabled, then level 1 MLA routing network line 526 is connected to level 1 MLA routing network line 520. Otherwise, line 526 is not connected to line 520. Switch 583 is programmable by the user. The turn points are placed as pair-wise groups with the objective of providing switching access connecting two or more block connectors first through the block connector to level 1 MLA exchange networks and then connecting selected level 1 MLA routing lines by enabling the switches. The level 1 MLA lines are used to connect those block connectors that reside in separate logical blocks within the same block cluster.

Figure 5C:
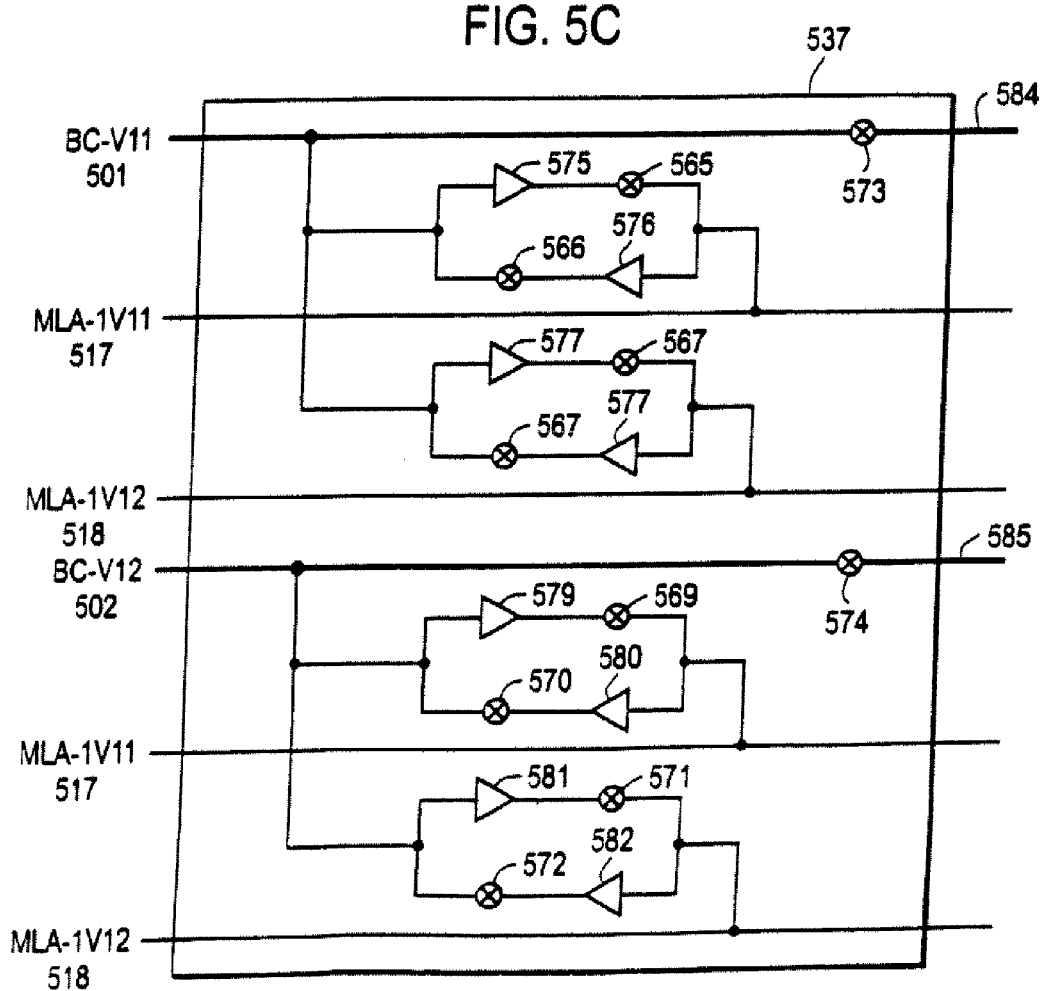
FIG. 5C shows an exchange network.

Referring back to FIG. 5A, there are eight block connector to level 1 MLA exchange networks 533-540 for each logical block. These exchange networks operate to connect certain block connectors to level 1 MLA lines as programmed by the user. FIG. 5C shows the exchange network 537 in greater detail. The block connector to level 1 MLA routing exchange network has eight drivers 575-582. These eight drivers 575-582 are used to provide bi-directional drive for the block connectors 501, 502 and level 1 MLA lines 517, 518. For example, enabling switch 565 causes the signal on block connector 501 to be driven by driver 575 onto the level 1 MLA line 517. Enabling switch 566 causes the signal on level 1 MLA line 517 to be driven by driver 576 onto the block connector 501. Enabling switch 567 causes the signal on block connector 501 to be driven by driver 577 onto the level 1 MLA line 518. Enabling switch 568 causes the signal on level 1 MLA line 518 to be driven by driver 578 onto the block connector 501.

Similarly, enabling switch 569 causes the signal on block connector 502 to be driven by driver 579 onto the level 1 MLA line 517. Enabling switch 570 causes the signal on level 1 MLA line 517 to be driven by driver 580 onto the block connector 502. Enabling switch 571 causes the signal on block connector 502 to be driven by driver 581 onto the level 1 MLA line 518. Enabling switch 572 causes the signal on level 1 MLA line 518 to be driven by driver 582 onto the block connector 502. Switch 573 is used to control whether a signal should pass form one block connector 501 to the adjacent block connector 584 belonging to the adjacent logical block.

Likewise, switch 574 is used to control whether a signal should pass form one block connector 502 to the adjacent block connector 585 belonging to the adjacent logical block.

Figure 6:
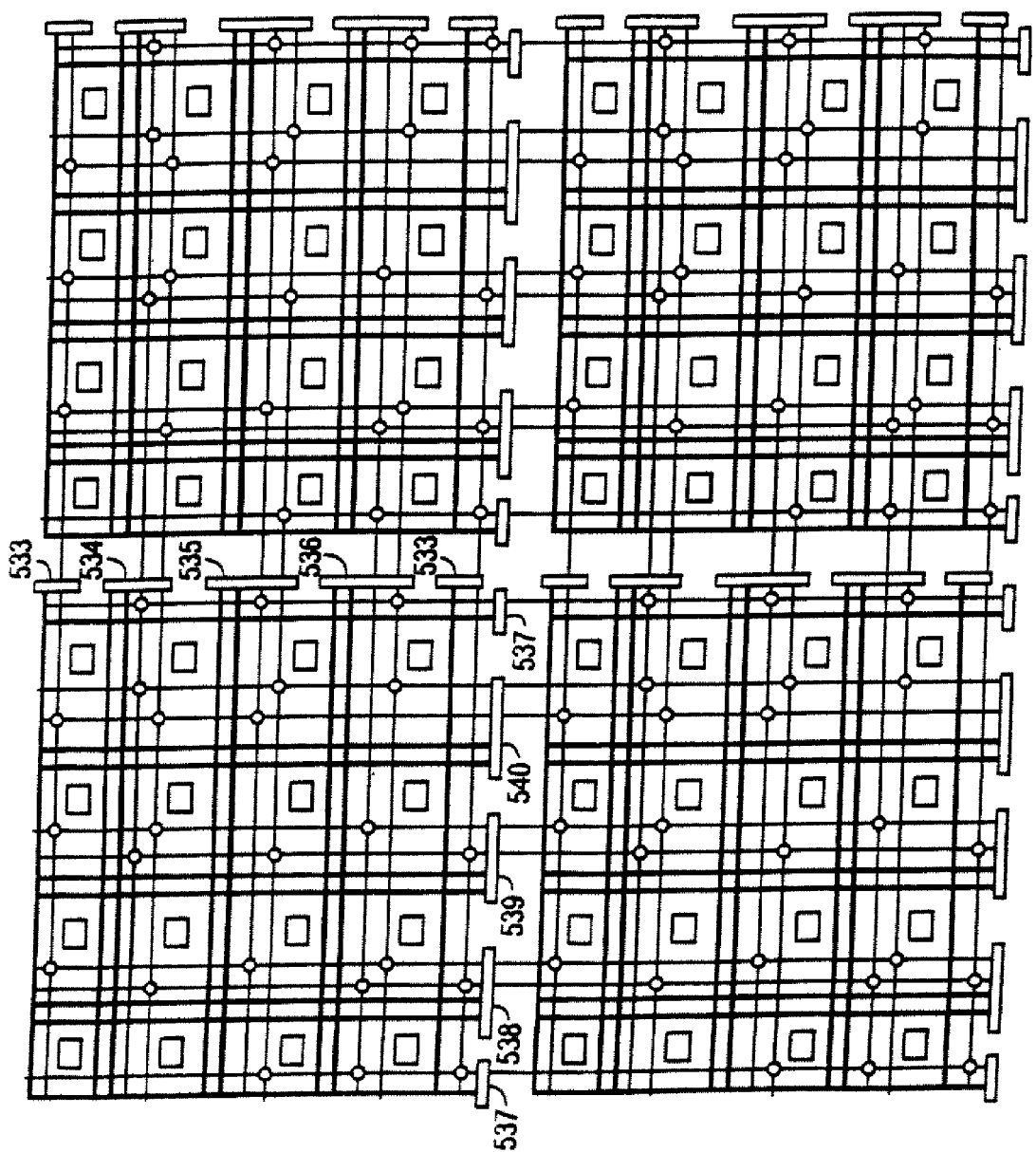
FIG. 6 shows the routing network for a block cluster.

FIG. 6 shows the routing network for a block cluster. The block cluster is basically comprised of four logical blocks which can be interconnected by the level 1 MLA exchange networks 533-540. It can be seen that there are thirty-two level 1 MLA routing network lines.

FIG. 7A shows the block diagram for a block sector. The block sector is comprised of four block clusters 701-704. As discussed above, the block clusters are interconnected by block connectors and level 1 MLA routing network lines. In addition, the block sector is also comprised of sixty-four level 2 MLA routing network lines and sixty-four level 2 to level 1 exchange networks to provide connectability between level 1 MLA routing network and level 2 MLA routing network. The level 1 to level 2 MLA routing exchange networks are depicted by rectangles in FIG. 7A. Furthermore, there are forty-eight level 2 MLA turn points associated with each of the four logical blocks within the block sector. Consequently, there are one hundred and ninety-two level 2 MLA turn points for the block sector.

FIG. 7B shows a sample level 1 to level 2 MLA routing exchange network 705. It can be seen that switch 710 is used to control whether a signal should pass between level 1 MLA line 709 and level 2 MLA line 708. Switch 711 is used to control whether a signal should pass between level 1 MLA line 709 and level 2 MLA line 707. Switch 712 is used to control whether a signal should pass between level 1 MLA line 706 and level 2 MLA line 708. Switch 713 is used to control whether a signal should pass between level 1 MLA line 706 and level 2 MLA line 707. Switch 714 is used to control whether a signal should pass form one level 1 MLA line 709 to the adjacent level 1 MLA line 716 belonging to the adjacent block cluster. Likewise, switch 715 is used to control whether a signal should pass form one level 1 MLA line 706 to the adjacent level 1 MLA line 715 belonging to the adjacent block cluster.

FIG. 8A shows a sector cluster. The sector cluster is comprised of four block sectors 801-804 with their associated block connectors, level 1, and level 2 MLA routing network lines and exchange networks. In addition, there are one hundred and twenty-eight level 3 MLA routing network lines, providing connectability between the level 2 MLA lines that belong to different block sectors 801-804 within the same sector cluster 800. There are ninety-six level 3 MLA turn points associated with the level 3 MLA lines for each of the block sector 801-804 (i.e. three hundred and eighty-four total level 3 MLA turn points for the sector cluster). Furthermore, there are thirty-two level 2 to level 3 MLA routing exchange networks associated with each of the four block sector 801-804. Hence, there are total of one hundred and twenty-eight level 3 MLA routing exchange network for providing programmable connectability between the various level 2 and level 3 MLA lines.

FIG. 8B shows an example of a level 2 to level 3 MLA routing exchange network 805. It can be seen that enabling switch 810 causes a signal on the level 2 MLA line 808 to be connected to the level 3 MLA line 806. Disabling switch 810 disconnects the level 2 MLA line 808 from the level 3 MLA line 806. Enabling switch 811 causes a signal on the level 2 MLA line 808 to be connected to the level 3 MLA line 807. Disabling switch 811 disconnects the level 2 MLA line 808 from the level 3 MLA line 807. Likewise, enabling switch 812 causes a signal on the level 2 MLA line 809 to be connected to the level 3 MLA line 806. Disabling switch 812 disconnects the level 2 MLA line 809 from the level 3 MLA line 806. Enabling switch 813 causes a signal on the level 2 MLA line 809 to be connected to the level 3 MLA line 807. Disabling switch 813 disconnects the level 2 MLA line 809 from the level 3 MLA line 807.

In the present invention, larger and more powerful FPGAs can be achieved by adding additional logic sector clusters which are connected by additional levels of MLA routing networks with the corresponding MLA turn points and exchange networks.

In one embodiment of the present invention, each of the five I-Matrix lines (331-335, FIG. 3A) can be extended to provide connectability between two adjacent I-Matrix lines belonging to two different clusters. The passgate switches 336-340, 341-345, 346-350, and 351-355 in FIG. 3B are examples of four different sets of I-Matrix line extension switches. This provides further flexibility by providing the capability of routing a signal between two adjacent clusters without having to be routed through the use of block connectors.

Similarly, block connectors can be extended to provide connectability between two adjacent block connectors belonging to two different logical blocks. Switch 573 of FIG. 5C illustrates such block connector extension connecting block connector 501 to block connector 584 through switch 573. This provides further flexibility by providing the capability of routing a signal between two adjacent logical blocks without having to be routed through the level 1 MLA lines and associated MLA exchange networks. This concept can be similarly applied to the level 1 MLA lines as well. Switch 714 of FIG. 7B shows an example where level 1 MLA line 709 is extended to connect to level 1 MLA line 716 by enabling switch 714. This provides further flexibility by providing the capability of routing a signal between two adjacent block clusters without having to be routed through the level 2 MLA lines and associated MLA exchange networks.

Thus, an architecture with an intraconnect and interconnect scheme for programmable logic circuits is disclosed.

What is claimed is:

1. A field programmable gate array architecture, comprising:
   (a) a first logical cluster having a first span in a first dimension and having a second span in a second dimension, the cluster comprising a plurality of cells, each cell comprising:
      an output,
      at least one input, and
      an input multiplexer coupled to each input;
   (b) a first plurality of intraconnect conductors within the first and second spans, wherein the output of each cell in the first logical cluster is selectively coupleable to at least one input multiplexer coupled to each of the other cells in the first logical cluster by traversing a single one of the first plurality of intraconnect conductors;
   (c) a second logical cluster having a third span in the first dimension and having a span in the second dimension equal to the second span, the cluster comprising a plurality of cells, each cell having:
      an output,
      at least one input, and
      an input multiplexer coupled to each input;
   (d) a second plurality of intraconnect conductors within the second and third spans, wherein the output of each cell in the second logical cluster is selectively coupleable to at least one input multiplexer coupled to each of the other cells in the second logical cluster by traversing a single one of the second plurality of intraconnect conductors;
   (e) a third logical cluster having a fourth span in the first dimension and a span in the second dimension equal to the second span, the cluster comprising a plurality of cells, each cell having:
      an output,
      at least one input, and
      an input multiplexer coupled to each input;
   (f) a third plurality of intraconnect conductors within the second and fourth spans, wherein the output of each cell in the third logical cluster is selectively coupleable to at least one input multiplexer coupled to each of the other cells in the third logical by traversing a single one of the third plurality of intraconnect conductors;
   (g) a fourth logical cluster having a fifth span in the first dimension and a span in the second dimension equal to the second span, the cluster comprising a plurality of cells, each cell having:
      an output,
      at least one input, and
      an input multiplexer coupled to each input;
   (h) a fourth plurality of intraconnect conductors within the second and fifth spans, wherein the output of each cell in the fourth logical cluster is selectively coupleable to at least one input multiplexer of each of the other cells in the fourth logical cluster by traversing a single one of the fourth plurality of intraconnect conductors.

2. A programmable logic circuit, comprising:
   an input configured to receive a signal into the programmable logic circuit;
   a plurality of cells coupled to the input, each of the plurality of cells configured to process the signal;
   a first set of routing lines configured to directly couple, through a first set of programmable switches, to the plurality of cells to form logical blocks of cells, wherein input and outputs of cells of logical blocks are programmably coupled to the first set of routing lines; and a second set of routing lines, configured to couple directly and bidirectionally to the first set of routing lines through a second set of programmable switches, each routing line of the first set of routing lines selectively configured to be a source to drive a routing line of the second set of routing lines through the second set of programmable switches and a sink to receive the signal through the second set of programmable switches from the routing line of the second set of routing lines, wherein a span of the second set of routing lines is longer than a span of the first set of routing lines.

3. The programmable logic circuit of claim 2, wherein the second set of programmable switches comprises components selected from the group consisting of switches, programmable passgates and program controlled drivers/receivers.

4. An integrated circuit, comprising:
a first region comprising:
   a first plurality of cells located along a first dimension and a second dimension, wherein the first region has a first span along the first dimension and a second span along the second dimension;
   a plurality of switches; and
   a first plurality of conductors located within the first region, wherein each conductor of the first plurality of conductors to selectively couple to inputs and outputs of cells of the first plurality of cells and conductors of the first plurality of conductors through the plurality of switches and wherein the first plurality of conductors span cells of the first plurality of cells along the first dimension and the second dimension, wherein the first plurality of conductors comprises:
      a first conductor having a first span along the first dimension;
      a second conductor having a second span along the first dimension;
      a third conductor having a third span along the second dimension; and
      a fourth conductor having a fourth span along the second dimension;
   wherein the first span of the first region is greater than the first span of the first conductor and the first span of the first conductor is greater than the second span of the second conductor,
   wherein the second span of the first region is greater than the third span of the third conductor and the third span of the third conductor is greater than the fourth span of the fourth conductor.

5. The integrated circuit of claim 4, further comprising a second region, located within the first region, having a span along the first dimension, comprising:
   a subgroup of cells of the first plurality of cells located in the second region, wherein the span of the second region is less than the second span of the second conductor;
   a fifth conductor of the first plurality of conductors located within the second region having a fifth span equal to the span of the second region along the first dimension.

* * * * *